(12) United States Patent
Zhang (10) Patent No.: US 10,515,984 B1
(45) Date of Patent: Dec. 24, 2019

(54) DISPLAY PANEL, DISPLAY DEVICE AND METHOD FOR PREPARING A LOW-TEMPERATURE POLYSILICON THIN FILM TRANSISTOR

(71) Applicant: Wuhan China Star Optoelectronics Technology Co., Ltd., Wuhan, Hubei (CN)

(72) Inventor: Jiawei Zhang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 261 days.

(21) Appl. No.: 15/579,250

(22) PCT Filed: Oct. 18, 2017

(86) PCT No.: PCT/CN2017/106736
§ 371 (c)(1),
(2) Date: Dec. 4, 2017

(87) PCT Pub. No.: WO2019/061586
PCT Pub. Date: Apr. 4, 2019

(30) Foreign Application Priority Data

Sep. 26, 2017 (CN) .......................... 2017 1 0883918

(51) Int. Cl.
*H01L 27/12* (2006.01)
*H01L 29/66* (2006.01)
(Continued)

(52) U.S. Cl.
CPC ........ *H01L 27/124* (2013.01); *H01L 27/1274* (2013.01); *H01L 29/42384* (2013.01);
(Continued)

(58) Field of Classification Search
None
See application file for complete search history.

(56) References Cited

U.S. PATENT DOCUMENTS

| 2018/0033808 A1* | 2/2018 | Li | H01L 21/02532 |
| 2019/0103420 A1* | 4/2019 | Liu | H01L 27/1259 |
| 2019/0204668 A1* | 7/2019 | Yang | H01L 27/1225 |

FOREIGN PATENT DOCUMENTS

| CN | 103887328 A | 6/2014 |
| CN | 104952880 A | 9/2015 |

(Continued)

*Primary Examiner* — Jack S Chen
(74) *Attorney, Agent, or Firm* — Hemisphere Law, PLLC; Zhigang Ma (57) ABSTRACT

A display panel, a display device and a method for preparing a low-temperature polysilicon thin film transistor are provided. The method includes: providing a base substrate; forming a semiconducting layer on the base substrate; forming a first insulating layer on the semiconducting layer; forming a first metal layer on the first insulating layer and patterning the first metal layer to obtain a first metal gate layer; forming a second insulating layer on the first metal layer; forming a second metal layer on the second insulating layer and patterning the second metal layer to obtain a second metal gate layer; forming a third insulating layer on the second metal layer; forming a third metal layer on the third insulating layer and patterning the third metal layer to form a source and a drain. The LTPS technology can be applied to the production of large-size panels by adopting the present disclosure.

20 Claims, 5 Drawing Sheets (51) Int. Cl.
  *H01L 29/49* (2006.01)
  *H01L 29/423* (2006.01)
  *H01L 29/786* (2006.01)

(52) U.S. Cl.
  CPC .... *H01L 29/4908* (2013.01); *H01L 29/66757* (2013.01); *H01L 29/78675* (2013.01)

(56) References Cited

FOREIGN PATENT DOCUMENTS

| CN | 104966718 A | 10/2015 |
| CN | 105336684 A | 2/2016 |
| CN | 105742296 A | 7/2016 |
| CN | 105931988 A | 9/2016 |

* cited by examiner

DISPLAY PANEL, DISPLAY DEVICE AND METHOD FOR PREPARING A LOW-TEMPERATURE POLYSILICON THIN FILM TRANSISTOR

RELATED APPLICATIONS

The present application is a National Phase of International Application Number PCT/CN2017/106736, filed Oct. 18, 2017, and claims the priority of China Application No. 201710883918.9, filed Sep. 26, 2017.

FIELD OF THE DISCLOSURE

The present disclosure relates to a display panel technology, and more particularly to a display panel, a display device, and a method for preparing a low-temperature polysilicon thin film transistor.

BACKGROUND

By applying a driving voltage to drive thin film transistor (TFT) in pixel unit is wildly used in various display devices. Amorphous silicon (a-Si) material with good stability and process ability has been used as a material of the active layer of the TFT for a long time. However, the lower carrier mobility of a-Si material cannot meet the requests for large-size and high-resolution display panels.

Based on high mobility of poly-silicon, a high-speed complementary metal oxide semiconductor (CMOS) driving system can be made directly on a substrate by adopting low-temperature polysilicon (LIPS) technology. Such that, the number of pins of an external printed circuit and the bonding points of wires are few, making the display panel fewer defects, improving the reliability of the product and increasing the durability. Compared to amorphous silicon (a-Si) thin film transistors, low-temperature polysilicon thin film transistors have more excellent physical electrical properties, such as smaller components, which can improve the light transmittance, thereby reducing the backlight load and prolonging the life of the liquid crystal display panel. Therefore, LTPS technology is widely used in the LCD industry. However, in the production of LTPS-TFT process, the production process temperature is up to 600° C., metals with relative low melting point cannot be used herein. In addition, due to the market demand for high-performance large-size panels, in the production process of the large-size panels, increasing panel size will increase the length of gate metal wires. The wiring trace becomes too long, and a corresponding resistance is increased. Such that the loading of the gate is too large, the screen uniformity of the panel cannot be guaranteed. If thicken the gate metal film layer directly, substrate fragmentation will be generated due to large stress, the actual purpose of production becomes meaningless. Therefore, metals with relative low resistivity are needed, aluminum and other metals having low melting point and low resistivity cannot be used, thus in the current process, molybdenum is used for the gate wire.

SUMMARY

Accordingly, the present disclosure provides a display panel, a display device and a method for preparing a polysilicon thin film transistor, which are capable to apply the LTPS technology to the production process of large size panels.

In one aspect, the present disclosure provides a method for preparing a low temperature polysilicon thin film transistor, comprising the following steps of; providing a base substrate; forming a semiconducting layer on the base substrate; forming a first insulating layer on the semiconducting layer; forming a first metal layer on the first insulation layer and patterning the first metal layer to obtain a first metal gate layer; forming a second insulating layer on the first metal layer; forming a second metal layer on the second insulation layer and patterning the second metal layer to obtain a second metal gate layer, wherein the first metal gate layer is connected to the second metal gate layer; forming a third insulating layer on the second metal layer; and forming a third metal layer on the third insulation layer and patterning the third metal layer to form a source and a drain, wherein the source and the drain are connected to the semiconducting layer.

Furthermore; the step of forming a semiconducting layer on the base substrate comprises: sequentially forming a buffer layer and an amorphous silicon layer on the base substrate; annealing the amorphous silicon layer to convert the amorphous silicon layer into a polysilicon layer; and ion doping the polysilicon layer to form the semiconducting layer.

Furthermore, the step of annealing the amorphous silicon layer specifically comprises: annealing the amorphous silicon layer by a laser annealing process; or annealing the amorphous silicon layer by an excimer laser annealing process.

Furthermore, the preparation method further comprises: forming a first via hole on the second insulating layer, wherein the first via hole is used for connecting the first metal gate layer to the second metal gate layer.

Furthermore; the preparation method further comprises: forming a second via hole on the third insulating layer, wherein the second via hole is used for connecting the source and the drain to the semiconducting layer.

Furthermore; a material of the first insulating layer comprises silicon nitride; and/or the preparation method further comprises: hydrogenating the semiconducting layer by using hydrogen in the first insulating layer as a hydrogen source.

Furthermore; a material of the first metal layer and the second metal layer is molybdenum.

Furthermore, a material of the buffer layer comprises at least one of silicon nitride and silicon oxide.

In another aspect, the present disclosure provides a display panel comprising a low-temperature polysilicon thin film transistor. The low-temperature polysilicon thin film transistor comprises: a base substrate; a semiconducting layer formed on the base substrate; a first insulating layer formed on the semiconducting layer; a first metal layer formed on the first insulating layer, wherein the first metal layer is patterned to obtain a first metal gate layer; a second insulating layer formed on the first metal layer; a second metal layer formed on the second insulating layer, wherein the second metal layer is patterned to obtain a second metal gate layer, wherein the first metal gate layer is connected to the second metal gate layer; a third insulating layer formed on the second metal layer; a third metal layer formed on the third insulating layer; wherein the third metal layer is patterned to obtain a source and a drain, wherein the source and the drain are connected to the semiconducting layer.

Furthermore, a forming process of the semiconducting layer comprises: sequentially forming a buffer layer and an amorphous silicon layer on the base substrate; annealing the amorphous silicon layer to convert the amorphous silicon layer into a polysilicon layer; and ion doping the polysilicon layer to form the semiconducting layer.

Furthermore, the step of annealing the amorphous silicon layer comprises: annealing the amorphous silicon layer by a laser annealing process; or annealing the amorphous silicon layer by an excimer laser annealing process.

Furthermore, the display panel further comprises a first via hole formed on the second insulation layer, wherein the first via hole is used for connecting the first metal gate layer to the second metal gate layer.

Furthermore, the display panel further comprises a second via hole formed on the third insulation layer, wherein the second via hole is used for connecting the source and the drain to the semiconducting layer.

Furthermore; a material of the first insulating layer comprises silicon nitride.

Furthermore, a material of the first metal layer and the second metal layer is molybdenum.

Furthermore; a material of the buffer layer comprises at least one of silicon nitride and silicon oxide.

In yet another aspect, the present disclosure provides a display device comprising a low-temperature polysilicon thin film transistor prepared by any one of the foregoing methods.

The method for preparing a low-temperature polysilicon thin film transistor provided by the present disclosure is based on the existing LTPS technology and materials, and applies the LTPS technology to the production of large-size panels without introducing the copper process or changing the process flow. Compared with the conventional process, the present disclosure can effectively improve the current situation that the trace impedance is too large to be able to be produced in large-size panels, and the fragmentation caused by thickening the gate metal film can directly be avoided.

BRIEF DESCRIPTION OF THE DRAWINGS

In order to provide a clearer description of the embodiments of the present disclosure, the present disclosure will be further described in the following description with reference to the accompanying drawings and embodiments. It will be apparent that the following description is a part of the present disclosure. In the ordinary skill of the present disclosure, other drawings may be obtained in accordance with these drawings without paying creative work.

BRIEF DESCRIPTION OF THE REFERENCES

Low-temperature polysilicon thin film transistor: 20.
Base substrate: 201,
Buffer layer: 202.
Silicon nitride layer: 2021.
Silicon oxide layer: 2022.
Amorphous silicon layer: 203'.
Polysilicon layer: 203',
Semiconducting layer: 203.
First insulating layer: 204,
First metal gate layer: 205.
Second insulating layer: 206,
First via hole: 2061.
Second metal gate layer: 207,
Third insulating layer: 208.
Second via hole: 2081.
Source, drain: 209.

DETAILED DESCRIPTION OF PREFERRED EMBODIMENTS

In order to understand the above objectives, features and advantages of the present disclosure more clearly, the present disclosure is described in detail below with references to the accompanying drawings and specific embodiments. It should be noted that, the embodiments of the present disclosure and the features in the embodiments may be combined with each other without conflict.

In the following description, numerous specific details are set forth in order to provide a thorough understanding of the present disclosure. The described embodiments are merely some but not all of the embodiments of the present disclosure. All other embodiments obtained by persons of ordinary skill in the art based on the embodiments of the present disclosure without creative efforts shall fall within the protection scope of the present disclosure.

Unless otherwise defined, all technical and scientific terms used herein have the same meaning as commonly understood by one of ordinary skill in the art to which this disclosure belongs. The terminology used in the description of the present disclosure herein is for the purpose of describing particular embodiments only, and is not intended to be limiting of the present disclosure.

Figure 1:
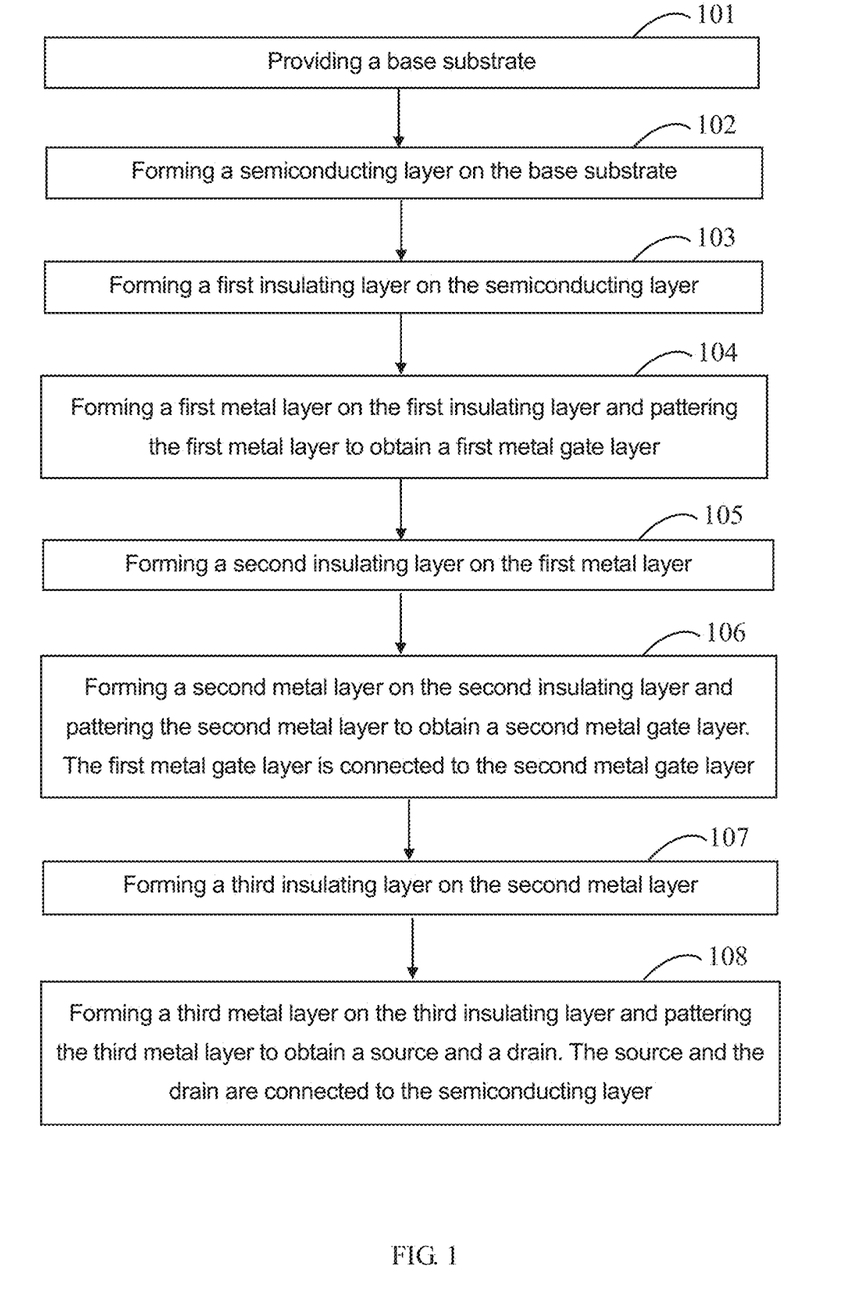
FIG. 1 is a flowchart of a method for preparing a low-temperature polysilicon thin film transistor according to one embodiment of the present disclosure.

Referring to FIG. 1, which is a flowchart of a method for preparing a low-temperature polysilicon thin film transistor according to one embodiment of the present disclosure. The method for preparing a low-temperature polysilicon thin film transistor comprises the following steps of:

Step 101, providing a base substrate 201. Please refer to FIGS. 1, 2A and 2B.

Figure 2A:
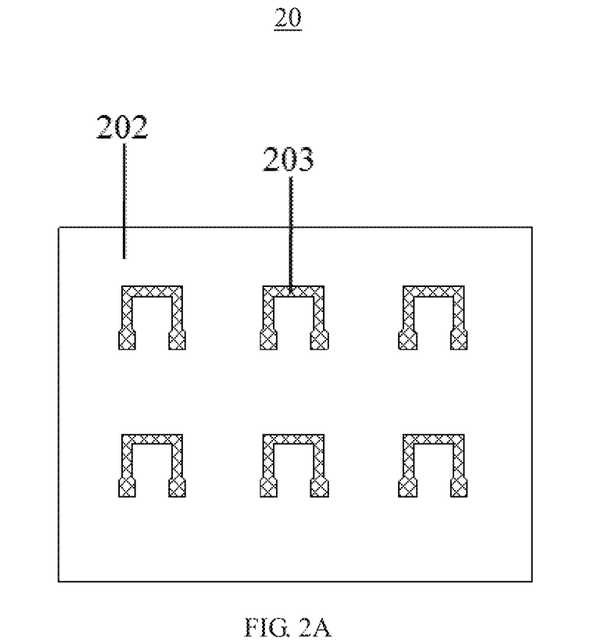
FIG. 2A is a top view schematic diagram of a low-temperature polysilicon thin film transistor after formed a semiconducting layer by the preparation method according to one embodiment of the present disclosure.
Figure 2B:
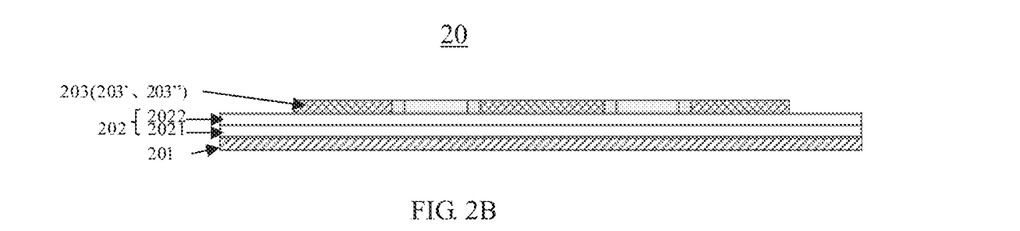
FIG. 2B is a cross-section schematic diagram related to FIG. 2A.

Step 102, forming a semiconducting layer 203 on the base layer 201.

In the present embodiment, Step 102 specifically comprises: sequentially forming a buffer layer 202 and an amorphous silicon layer 203' on the base substrate 201; annealing the amorphous silicon layer 203' to convert the amorphous silicon layer 203' into a polysilicon layer 203"; and ion doping the polysilicon layer 203" to form the semiconducting layer 203.

It should be understood that because the polysilicon layer 203" is directly ion doped, FIG. 2B only display a doped pattern.

In the present embodiment, the buffer layer 202 is prepared all over the surface of the base substrate 201. Wherein, a material of the buffer layer 202 comprises at least one of silicon nitride and silicon oxide.

In the present embodiment, the buffer layer 202 comprises a silicon nitride layer 2021 and a silicon oxide layer 2022.

The buffer layer 202 can increase the adhesion between the gate layer and the base substrate 201, and at the same time can prevent the metal ions in the base substrate 201 from diffusing into the gate layer to reduce the current leakage.

It should be understood that in other embodiments, the buffer layer 202 can also be omitted.

In the present embodiment, the step of annealing the amorphous silicon layer 203' specifically comprises: annealing the amorphous silicon layer 203' by a laser annealing process; or annealing the amorphous silicon layer 203' by an excimer laser annealing process.

Figure 3A:
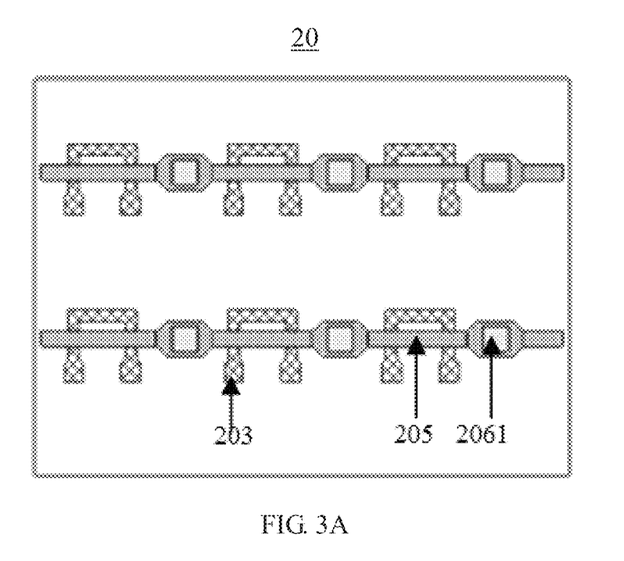
FIG. 3A is a top view schematic diagram of a low-temperature polysilicon thin film transistor after formed a first metal gate layer by the preparation method according to one embodiment of the present disclosure.
Figure 3B:
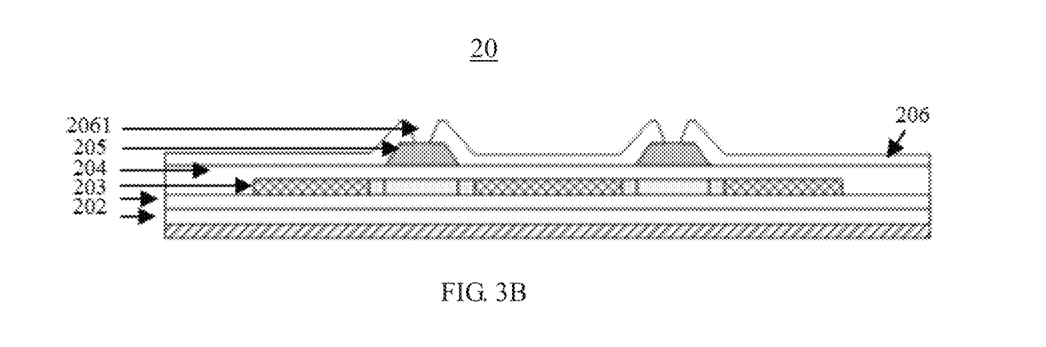
FIG. 3B is a cross-section schematic diagram related to FIG. 3A.

Step 103, as shown in FIGS. 3A-3B. Forming a first insulating layer 204 on the semiconducting layer 203. Wherein a material of the first insulating layer 204 comprises silicon nitride.

In the present embodiment, the preparation method further comprises: hydrogenating the semiconducting layer 203 by using hydrogen in the first insulating layer 204 as a hydrogen source.

Step 104, forming a first metal layer on the first insulation layer 204 and patterning the first metal layer to obtain a first metal gate layer 205.

In the present embodiment, the first metal layer can be patterned by photolithography, as to form the first metal gate layer 205.

Step 105, forming a second insulating layer 206 on the first metal layer.

Figure 4A:
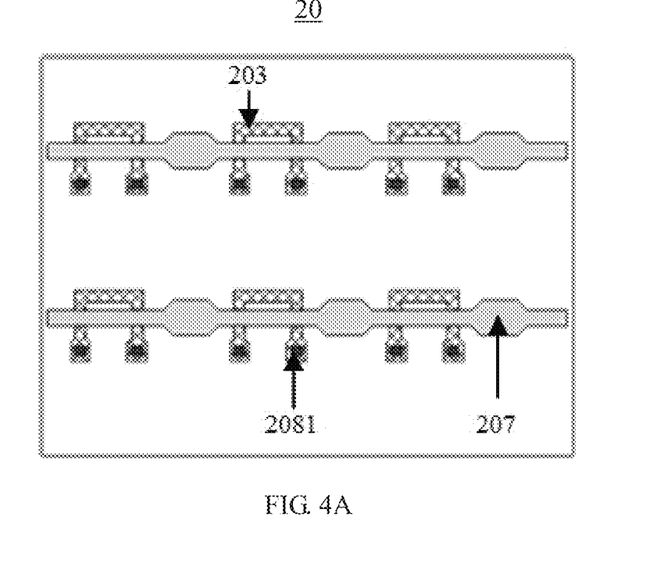
FIG. 4A is a top view schematic diagram of a low-temperature polysilicon thin film transistor after formed a second metal gate layer by the preparation method according to one embodiment of the present disclosure.
Figure 4B:
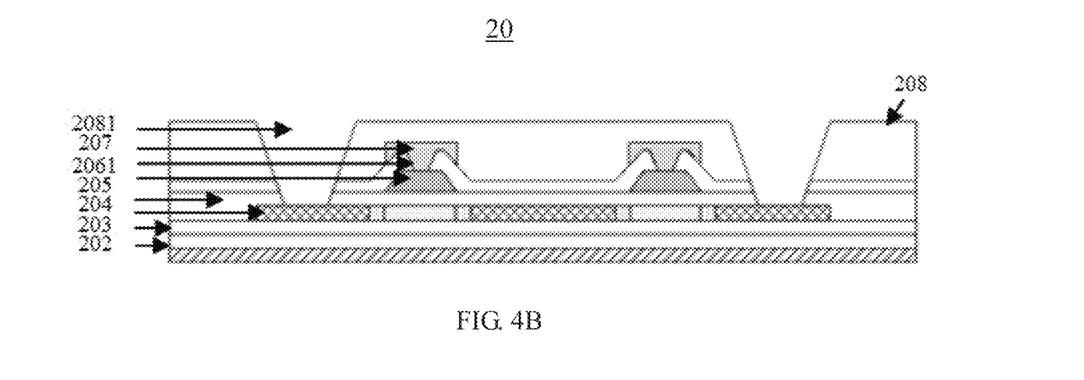
FIG. 4B is a cross-section schematic diagram related to FIG. 4A.

Step 106, as shown in FIGS. 41-4B. Forming a second metal layer on the second insulation layer 206 and patterning the second metal layer to obtain a second metal gate layer 207. Wherein the first metal gate layer 205 is connected to the second metal gate layer 207, so as to reduce gate electrode impedance.

In the present embodiment, the second metal layer can be patterned by photolithography, as to form the second metal gate layer 207.

In the present embodiment, the preparation method further comprises: forming a first via hole 2061 on the second insulating layer 206, wherein the first via hole 2061 is used for connecting the first metal gate layer 205 to the second metal gate layer 207.

In the present embodiment, a material of the first metal layer and the second metal layer is molybdenum. In other embodiments, the material of the first metal layer and the second metal layer may comprises at least of molybdenum, tantalum, aluminum, and tungsten. Those metal are common materials for preparing thin film transistors, and are easy to use.

Step 107, forming a third insulating layer 208 on the second metal layer.

Figure 5A:
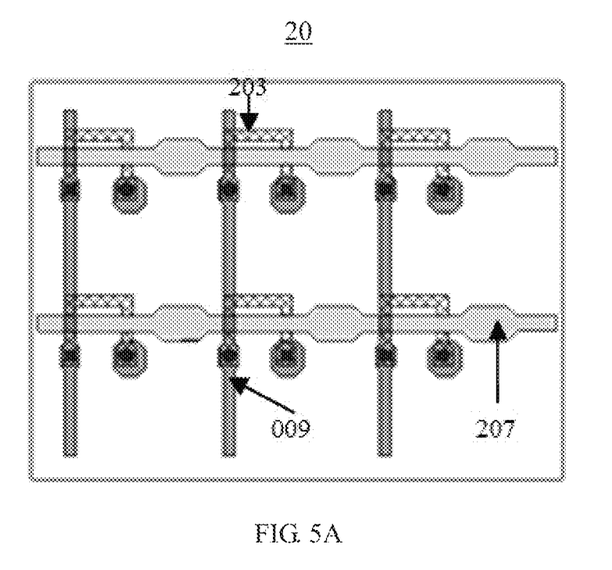
FIG. 5A is a top view schematic diagram of a low-temperature polysilicon thin film transistor after formed a source and a drain by the preparation method according to one embodiment of the present disclosure.
Figure 5B:
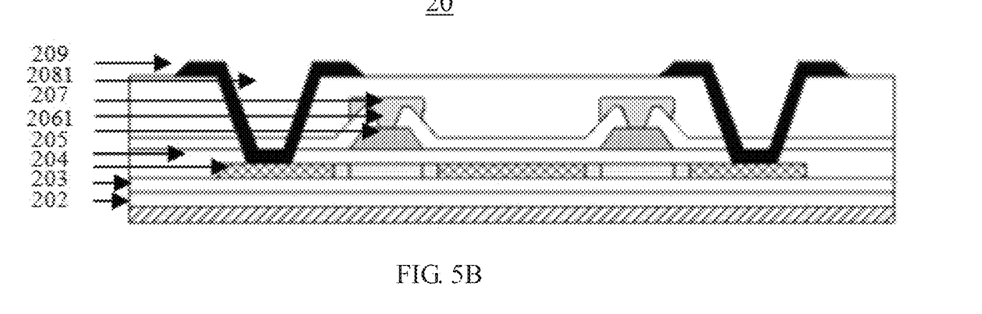
FIG. 5B is a cross-section schematic diagram related to FIG. 5A.

Step 108, as shown in FIGS. 5A-5B. Forming a third metal layer on the third insulation layer 208 and patterning the third metal layer to form a source and a drain 209. Wherein the source and the drain 209 are connected to the semiconducting layer 203.

In the present embodiment, the preparation method further comprises: forming a second via hole 2081 on the third insulating layer 208, wherein the second via hole 2081 is used for connecting the source and the drain 209 to the semiconducting layer 203.

The method for preparing a low-temperature polysilicon thin film transistor provided by the present disclosure is based on the existing LTPS technology and materials, and applies the LTPS technology to the production of large-size panels without introducing the copper process or changing the process flow. Compared with the conventional process, the present disclosure can effectively improve the current situation that the trace impedance is too large to be able to be produced in large-size panels, and the fragmentation caused by thickening the gate metal film can directly be avoided.

Based on the foregoing method for preparing a low-temperature polysilicon thin film transistor, one embodiment of the present disclosure further provides a display panel comprising any one of the low-temperature polysilicon thin film transistors 20 as described above. Referring to FIG. 5B, the low-temperature polysilicon thin film transistor 20 comprises a base substrate 201, a semiconducting layer 203, a first insulating layer 204, a first metal gate layer 205, a second insulating layer 206, a first via hole 2061, a second metal gate layer 207, a second via hole 2081, a third insulating layer 208, a source and a drain 209.

Wherein, the semiconducting layer 203 is formed on the base substrate 201.

In the present embodiment, the low-temperature polysilicon thin film transistor 20 further comprises a buffer layer 202 formed between the base substrate 201 and the semiconducting layer 203. Wherein the buffer layer 202 is formed all over the base substrate 201, a material of the buffer layer 202 comprises at least one of silicon nitride and silicon oxide.

In the present embodiment, the buffer layer 202 comprises a silicon nitride layer 2021 and a silicon oxide layer 2022.

The buffer layer 202 can increase the adhesion between the gate layer and the base substrate 201, and at the same time can prevent the metal ions in the base substrate 201 from diffusing into the gate layer to reduce the current leakage.

It should be understood that in other embodiments, the buffer layer can also be omitted.

In the present embodiment, a process for forming the semiconducting layer 203 comprises: forming an amorphous silicon layer 203' on the buffer layer 202; annealing the amorphous silicon layer 203' to convert the amorphous silicon layer 203' into a polysilicon layer 203"; and ion doping the polysilicon layer 203" to form the semiconducting layer 203.

It should be understood that because the polysilicon layer 203" is directly ion doped, FIG. 5B only display a doped pattern.

In the present embodiment, the step of annealing the amorphous silicon layer 203' specifically comprises: annealing the amorphous silicon layer 203' by a laser annealing process; or annealing the amorphous silicon layer 203' by an excimer laser annealing process.

In the present embodiment, the first insulating layer 204 is formed on the semiconducting layer 203. Wherein a material of the first insulating layer 204 comprises silicon nitride.

In the present embodiment, a process for forming the first metal gate layer 205 comprises: forming a first insulating layer 204 on the first metal layer, and patterning the first metal layer to obtain the first metal gate layer 205.

Wherein the first metal layer can be patterned by photolithography, as to form the first metal gate layer 205.

A second insulating later 206 is formed on the first metal layer.

In the present embodiment, a process for forming the second metal gate layer 207 comprises: forming a second metal layer on the second insulation layer 206 and patterning the second metal layer to obtain a second metal gate layer 207. Wherein the first metal gate layer 205 is connected to the second metal gate layer 207, so as to reduce the gate electrode impedance.

Wherein the second metal layer can be patterned by photolithography, as to form the second metal gate layer 207.

In the present embodiment, a first via hole 2061 is formed on the second insulating layer 206. The first via hole 2061 is used for connecting the first metal gate layer 205 to the second metal gate layer 207.

In the present embodiment, a material of first metal layer and the second metal layer is molybdenum. In other embodiments, the material of the first metal layer and the second metal layer may comprises at least of molybdenum, tantalum, aluminum, and tungsten. Those metal are common materials for preparing thin film transistors, and are easy to use.

A third insulating layer 208 is formed on the second metal layer.

In the present embodiment, a process for forming a source and a drain 209 comprises: forming a third metal layer on the third insulation layer 208 and patterning the third metal layer to form the source and the drain 209. Wherein the source and the drain 209 are connected to the semiconducting layer 203.

In the present embodiment, a second via hole 2081 is formed on the third insulating layer 208. The second via hole 2081 is used for connecting the source and the drain 209 to the semiconducting layer 203.

Based on the foregoing method for preparing a low-temperature polysilicon thin film transistor, the present embodiment further provides a display device comprising any one of the low-temperature polysilicon thin film transistors as described above. The display device can be any product or component that has a display function, such as liquid crystal display panel, electronic paper, cell phone, tablet, television, monitor, notebook, digital photo frame, navigator, and so on. The display device provided by the present disclosure adopts the low-temperature polysilicon thin film transistor 20 in above embodiments, so that a large-screen display can be realized.

While the disclosure has been particularly shown and described with reference to exemplary embodiments thereof, it will be understood by those skilled in the art that various changes in form and details may be made therein without departing from the spirit and scope of the disclosure as defined by the appended claims and their equivalents.

What is claim is:

1. A method for preparing a low-temperature polysilicon thin film transistor, comprising the following steps:
   providing a base substrate;
   forming a semiconducting layer on the base substrate;
   forming a first insulating layer on the semiconducting layer;
   forming a first metal layer on the first insulation layer and patterning the first metal layer to obtain a first metal gate layer;
   forming a second insulating layer on the first metal layer;
   forming a second metal layer on the second insulation layer and patterning the second metal layer to obtain a second metal gate layer, wherein the first metal gate layer is connected to the second metal gate layer;
   forming a third insulating layer on the second metal layer; and
   forming a third metal layer on the third insulation layer and patterning the third metal layer to form a source and a drain, wherein the source and the drain are connected to the semiconducting layer.

2. The method for preparing a low-temperature polysilicon thin film transistor according to claim 1, wherein the step of forming a semiconducting layer on the base substrate comprises:
   sequentially forming a buffer layer and an amorphous silicon layer on the base substrate;
   annealing the amorphous silicon layer to convert the amorphous silicon layer into a polysilicon layer; and
   ion doping the polysilicon layer to form the semiconducting layer.

3. The method for preparing a low-temperature polysilicon thin film transistor according to claim 2, wherein the step of annealing the amorphous silicon layer specifically comprises:
   annealing the amorphous silicon layer by a laser annealing process; or
   annealing the amorphous silicon layer by an excimer laser annealing process.

4. The method for preparing a low-temperature polysilicon thin film transistor according to claim 2, wherein a material of the buffer layer comprises at least one of silicon nitride and silicon oxide.

5. The method for preparing a low-temperature polysilicon thin film transistor according to claim 1, further comprising:
   forming a first via hole on the second insulating layer, wherein the first via hole is used for connecting the first metal gate layer to the second metal gate layer.

6. The method for preparing a low-temperature polysilicon thin film transistor according to claim 5, further comprising:
   forming a second via hole on the third insulating layer, wherein the second via hole is used for connecting the source and the drain to the semiconducting layer.

7. The method for preparing a low-temperature polysilicon thin film transistor according to claim 1, wherein a material of the first insulating layer comprises silicon nitride; and/or the preparation method further comprises:
   hydrogenating the semiconducting layer by using hydrogen in the first insulating layer as a hydrogen source.

8. The method for preparing a low-temperature polysilicon thin film transistor according to claim 1, wherein a material of the first metal layer and the second metal layer is molybdenum.

9. A display device; comprising a low-temperature polysilicon thin film transistor prepared by the method according to claim 1.

10. The display device according to claim 9, wherein the step of forming a semiconducting layer on the base substrate comprises:
    sequentially forming a buffer layer and an amorphous silicon layer on the base substrate;
    annealing the amorphous silicon layer to convert the amorphous silicon layer into a polysilicon layer; and
    ion doping the polysilicon layer to form the semiconducting layer.

11. The display device according to claim 9, wherein the further comprises:

forming a first via hole on the second insulating layer, wherein the first via hole is used for connecting the first metal gate layer to the second metal gate layer.

12. The display device according to claim 11, wherein the method further comprises:
    forming a second via hole on the third insulating layer, wherein the second via hole is used for connecting the source and the drain to the semiconducting layer.

13. A display panel, comprising a low-temperature polysilicon thin film transistor, wherein the low-temperature polysilicon thin film transistor comprises:
    a base substrate;
    a semiconducting layer formed on the base substrate;
    a first insulating layer formed on the semiconducting layer;
    a first metal layer formed on the first insulating layer, wherein the first metal layer is patterned to obtain a first metal gate layer;
    a second insulating layer formed on the first metal layer;
    a second metal layer formed on the second insulating layer, wherein the second metal layer is patterned to obtain a second metal gate layer, wherein the first metal gate layer is connected to the second metal gate layer;
    a third insulating layer formed on the second metal layer;
    a third metal layer formed on the third insulating layer, wherein the third metal layer is patterned to obtain a source and a drain, wherein the source and the drain are connected to the semi conducting layer.

14. The display panel according to claim 13, wherein a forming process of the semiconducting layer comprising:
    sequentially forming a buffer layer and an amorphous silicon layer on the base substrate;
    annealing the amorphous silicon layer to convert the amorphous silicon layer into a polysilicon layer; and
    ion doping the polysilicon layer to form the semiconducting layer.

15. The display panel according to claim 14, wherein the step of annealing the amorphous silicon layer comprises:
    annealing the amorphous silicon layer by a laser annealing process; or
    annealing the amorphous silicon layer by an excimer laser annealing process.

16. The display panel according to claim 14; wherein a material of the buffer layer comprises at least one of silicon nitride and silicon oxide.

17. The display panel according to claim 13, further comprising a first via hole formed on the second insulation layer, wherein the first via hole is used for connecting the first metal gate layer to the second metal gate layer.

18. The display panel according to claim 17, further comprising a second via hole formed on the third insulation layer, wherein the second via hole is used for connecting the source and the drain to the semiconducting layer.

19. The display panel according to claim 13, wherein a material of the first insulating layer comprises silicon nitride.

20. The display panel according to claim 13, wherein a material of the first metal layer and the second metal layer is molybdenum.

* * * * *